United States Patent
Brandenburg et al.

(10) Patent No.: US 7,440,282 B2
(45) Date of Patent: Oct. 21, 2008

(54) HEAT SINK ELECTRONIC PACKAGE HAVING COMPLIANT PEDESTAL

(75) Inventors: Scott D. Brandenburg, Kokomo, IN (US); Suresh K. Chengalva, Carmel, IN (US); David W. Zimmerman, Fishers, IN (US)

(73) Assignee: Delphi Technologies, Inc., Troy, MI (US)

( * ) Notice: Subject to any disclaimer, the term of this patent is extended or adjusted under 35 U.S.C. 154(b) by 79 days.

(21) Appl. No.: 11/434,644

(22) Filed: May 16, 2006

(65) Prior Publication Data

US 2007/0268671 A1 Nov. 22, 2007

(51) Int. Cl.
*H05K 7/20* (2006.01)

(52) U.S. Cl. .......... 361/704; 361/707; 361/715; 361/719; 165/80.3; 165/185

(58) Field of Classification Search ........... 361/704, 361/707, 710, 715, 719, 760, 730, 736; 257/E23.101, 257/E23.104, E21.503; 165/80.3, 185; 174/16.3
See application file for complete search history.

(56) References Cited

U.S. PATENT DOCUMENTS

| | | | | |
|---|---|---|---|---|
| 4,899,256 A | * | 2/1990 | Sway-Tin | 361/715 |
| 5,402,313 A | * | 3/1995 | Casperson et al. | 361/710 |
| 5,777,844 A | * | 7/1998 | Kiefer | 361/704 |
| 5,808,868 A | * | 9/1998 | Drekmeier | 361/704 |
| 5,812,375 A | * | 9/1998 | Casperson | 361/707 |
| 5,914,531 A | * | 6/1999 | Tsunoda et al. | 257/668 |
| 6,025,991 A | * | 2/2000 | Saito | 361/704 |
| 6,180,436 B1 | | 1/2001 | Koors et al. | |
| 6,185,100 B1 | * | 2/2001 | Bentz et al. | 361/704 |
| 7,050,305 B2 | * | 5/2006 | Thorum | 361/719 |
| 7,251,133 B2 | * | 7/2007 | Wallace | 361/690 |
| 2005/0078456 A1 | * | 4/2005 | Mandel et al. | 361/719 |
| 2006/0113680 A1 | * | 6/2006 | DiStefano | 257/779 |
| 2006/0274512 A1 | * | 12/2006 | Brandenburg et al. | 361/760 |
| 2006/0281230 A1 | * | 12/2006 | Brandenburg et al. | 438/127 |

* cited by examiner

*Primary Examiner*—Jayprakash N Gandhi
*Assistant Examiner*—Courtney L Smith
(74) *Attorney, Agent, or Firm*—Jimmy L. Funke

(57) ABSTRACT

An electronic package is provided for dissipating heat away from electronic devices. The package includes a substrate and electronic devices mounted on the substrate. The package also has a thermally conductive heat sink assembled over the electronic device. The heat sink includes compliant pedestals each having a contact surface for contacting a surface of an electronic device to conduct thermal energy away from the electronic device. The package is held together such that the heat sink is in contact with the surface of an electronic device such that each compliant pedestal applies a compressive force to the surface of the electronic device.

15 Claims, 3 Drawing Sheets

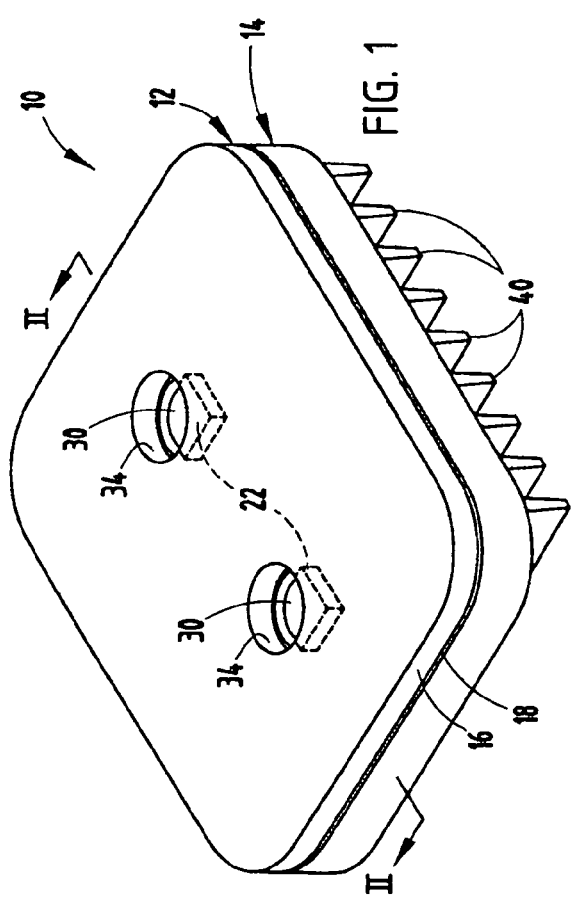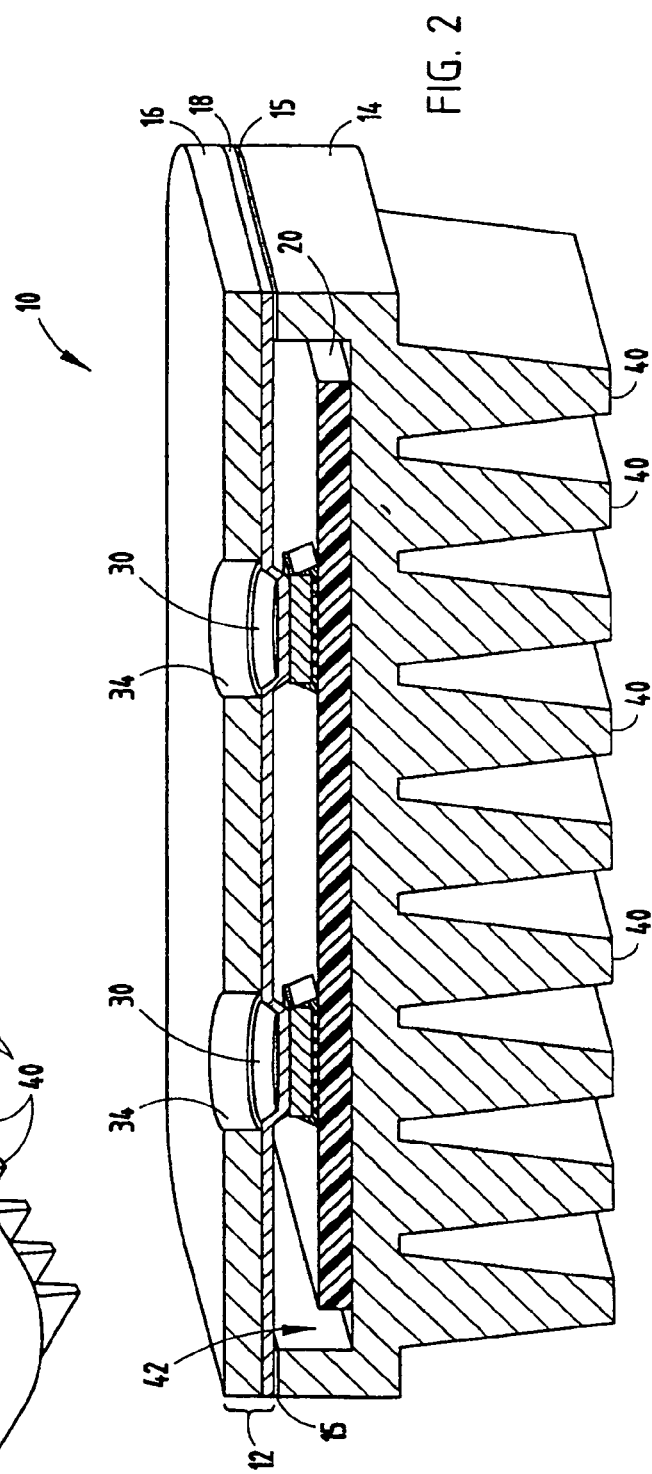

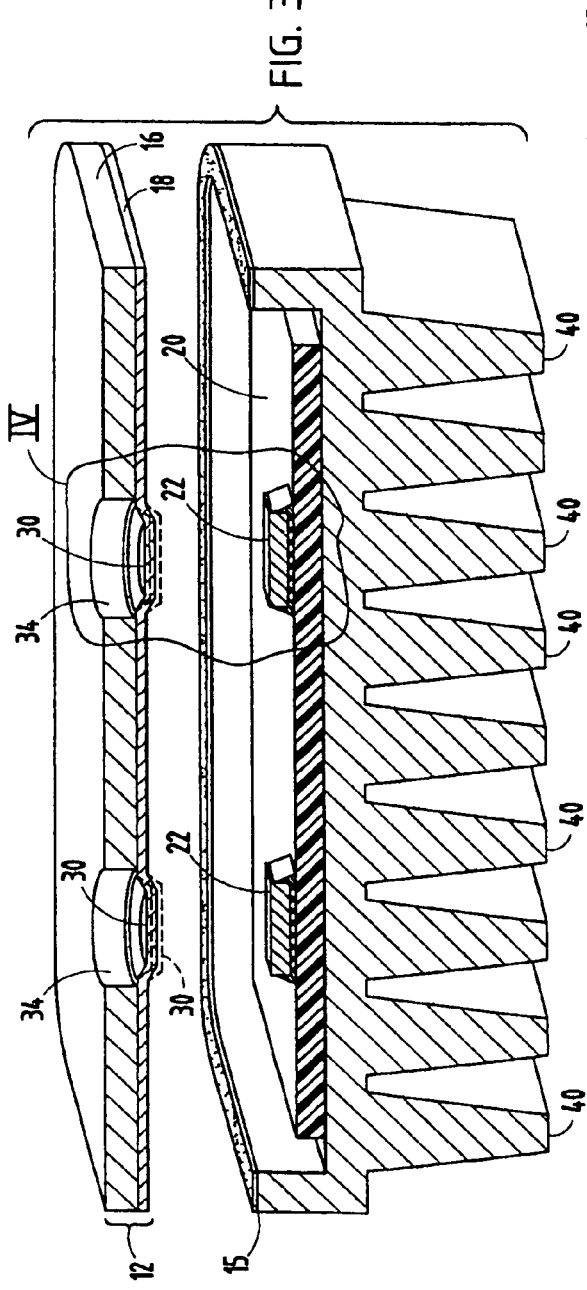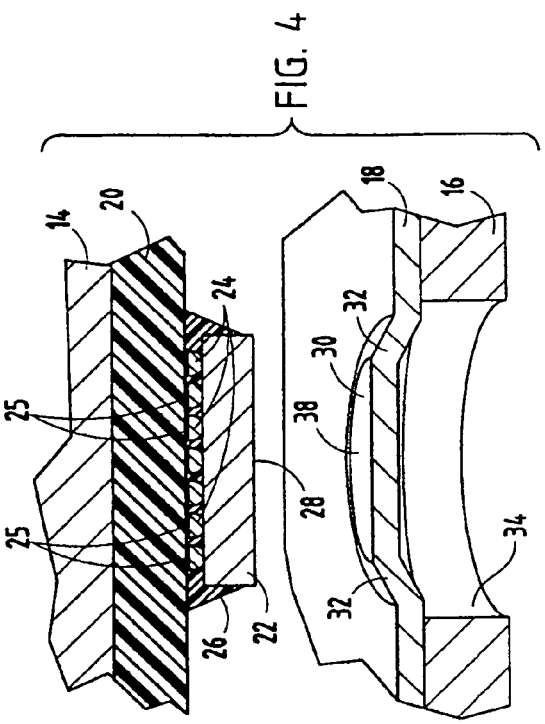

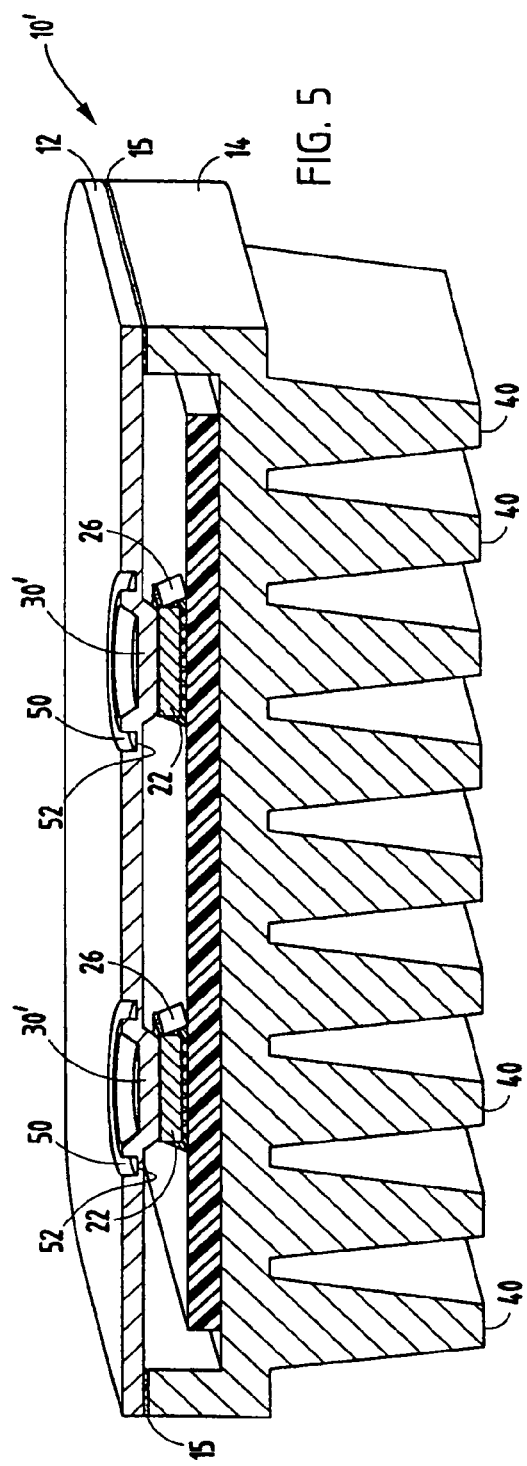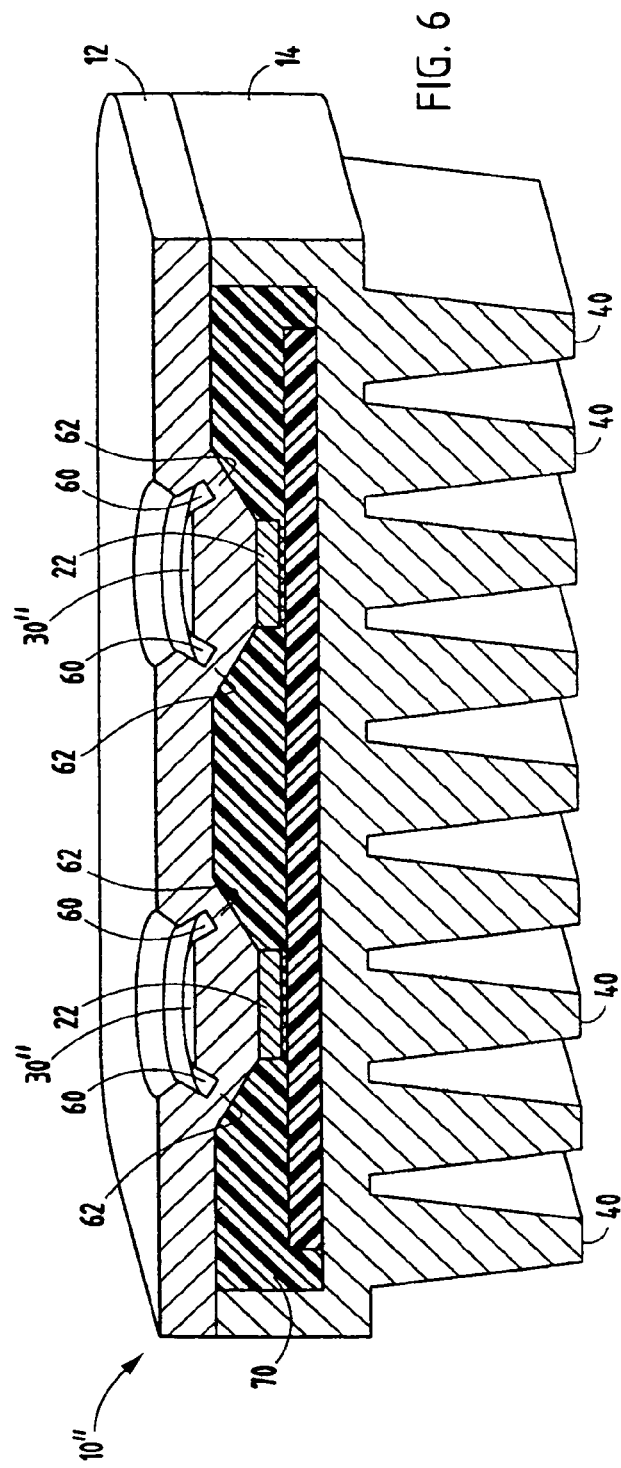

HEAT SINK ELECTRONIC PACKAGE HAVING COMPLIANT PEDESTAL

TECHNICAL FIELD

The present invention generally relates to electronic packages and, more particularly, relates to a semiconductor electronic package having a heat sink assembly for dissipating heat away from the semiconductor device(s).

BACKGROUND OF THE INVENTION

Electronic packages, such as electronic control modules, generally contain electronic devices, such as surface mount components, typically having fabricated electrical integrated circuitry (IC). The circuitry conducts electrical current which, in turn, generates thermal energy (i.e. heat) within the electronic package. The heat may build-up to an elevated temperature within the package. Excessive heat in electronic devices and other components within an electronic package may lead to adverse effects including electrical circuit failure. Thus, it is desirable to dissipate heat away from some electronic packages.

Many electronic packages employ semiconductor devices in the form of surface mount components soldered or otherwise connected to the surface of a substrate. Examples of surface mount components include flip chips and insulated gate bi-polar transistor (IGBT) chips. Some conventional techniques for dissipating thermal energy away from the electronic package employ a thermally conductive heat sink supported in contact with the package, held in place via clamps or directly mounting the heat sink onto a printed circuit board. One approach for conducting heat from a flip chip semiconductor device is disclosed in U.S. Pat. No. 6,180,436, the entire disclosure of which is hereby incorporated herein by reference. The aforementioned approach employs a flip chip mounted on a flexible substrate, having a rigid heat-conductive pedestal brought into thermal contact with one surface of the flip chip, and a biasing member. The biasing member biases the substrate against the flip chip to maintain thermal contact between the chip and the heat-conductive pedestal member.

Other heat sink assemblies employ a rigid circuit board mounted to a metal back plate which forms a case of a housing. Because of various tolerance issues and since there generally is no compliance built into the packaging, an inconsistent bond-line typically exists between the semiconductor IC devices and the rigid heat sink pedestals. The tolerance stack-ups of the various electronic devices makes it difficult to maintain a consistent thin thermal joint between the back side of the IC devices and the respective pedestals on the heat sink cover. The existence of a thin thermal joint is generally necessary for low thermal resistance of the IC devices to the heat sink material of the housing. Some compliance generally must be designed into the assembly at the expense of added parts and cost to accommodate for the tolerance stack-ups.

While conventional electronic package assemblies generally suffice to dissipate some of the thermal energy (heat) away from the semiconductor device(s), many packages do not offer optimal heat dissipation. The rigid pedestals in the heat sink cover of some conventional packages typically are not kept in optimal thermal conductive contact with the semiconductor device(s), thereby resulting in less than optimal thermal conductivity and inefficient heat transfer. Other conventional packages typically require added parts and costs in an attempt to improve the thermal contact.

Accordingly, it is therefore desirable to provide for a cost-affordable electronic package and method of dissipating thermal energy (heat) away from the semiconductor device in an optimal and efficient manner.

SUMMARY OF THE INVENTION

In accordance with the teachings of the present invention, an electronic package and method are provided for dissipating heat away from the electronic device. According to one aspect of the present invention, the package includes a substrate and an electronic device mounted on the substrate. The electronic device has electrical circuitry, a first surface and a second surface of oppositely disposed from the first surface. The package also has a thermally conductive heat sink assembled over the electronic device. The heat sink device includes a compliant pedestal having a contact surface for contacting the second surface of the electronic device to conduct thermal energy away from the electronic device. The package further has a holder for holding the contact surface of the heat sink in contact with the second surface of the electronic device such that the compliant pedestal compresses to apply a compressive force to the second surface of the electronic device.

According to another aspect of the present invention, an electronic package is provided including a rigid substrate and an electronic device mounted on the substrate. The electronic device includes electrical circuitry, a first surface and a second surface oppositely disposed from the first surface. The package has a housing for housing the circuit board and the electronic device. The housing includes upper and lower housing members. The upper housing member has a thermally conductive heat sink assembled onto the electronic device. The heat sink device includes a compliant pedestal that has a contact surface for contacting the second surface of electronic device, such that the compliant pedestal compresses to apply a compressive force to the second surface of the electronic device.

According to a further aspect of the present invention, a method for assembling an electronic package and conducting thermal energy away from an electronic device is provided. The method includes the steps of providing a substrate and mounting an electronic device to the substrate. The electronic device has electrical circuitry, a first surface and a second surface oppositely disposed from the first surface. The method also includes the steps of forming a thermally conductive heat sink having a compliant pedestal with a contact surface, and assembling the heat sink device such that the contact surface of the compliant pedestal is in contact with the second surface of the electronic device. The method further includes the step of holding the heat sink device such that the contact surface of the compressive pedestal is in compressive contact with the the second surface of the electronic device such that the compliant pedestal compresses to apply pressure contact to the electronic device.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIG. 1 is a perspective view of an electronic package having compliant pedestals formed in a heat sink housing member;

FIG. 2 is a cross-sectional view taken through lines II-II in FIG. 1 illustrating the compliant pedestals according to a first embodiment of the present invention;

FIG. 3 is an exploded perspective view of the electronic package shown in FIG. 1;

FIG. 4 is an enlarged exploded view of section IV-IV of FIG. 3;

FIG. 5 is a cross-sectional view of an electronic package having compliant pedestals according to a second embodiment; and FIG. 6 is a cross-sectional view of an electronic package having compliant pedestals according to a third embodiment.

DESCRIPTION OF THE PREFERRED EMBODIMENTS

Referring now to FIGS. 1-4, an electronic package 10 is illustrated having a housing made up of a lower housing member 14 in the form of a case and an upper housing member 12 in the form of a cover. The upper and lower housing members 14 and 12 are held (secured) together via an adhesive 15 to form a compartment 42 containing a substrate 20. The substrate 20 may be a printed circuit board having electrical circuitry formed on the top surface thereof. Electronic devices 22, such as surface mount components, are solder connected on the bottom surface to electrical circuit contact pads 25 formed on the top surface of the substrate 20. The top surfaces of the electronic devices 22, in turn, are contacted by respective compliant pedestals 30 formed in the upper housing member 12. The upper housing member thereby serves as an efficient heat sink to conduct thermal energy away from the electronic devices 22 to the outside environment.

The substrate 20 is shown disposed on a top surface of lower housing member 14, and may be adhered or otherwise connected thereto. According to one embodiment, the substrate 20 is a rigid substrate employing known substrate material, such as low temperature co-fired ceramic (LTCC) or FR4. According to another embodiment, the substrate 20 may be a non-rigid or compliant substrate. The substrate 20, described in one exemplary embodiment as a printed circuit board, has electrical circuitry formed on the top surface thereof including contact pads 25 for contacting circuitry on the bottom surface of flip chips 22. The substrate 20 may further have circuitry extending through the substrate including circuitry formed in intermediate layers and on the bottom surface. It is also contemplated that one or more electronic devices 22 may be connected to the bottom surface of substrate 20 and in contact with compliant pedestals formed on the upper surface of the lower housing member 14.

The electronic devices 22 are shown as IC flip chip semiconductor devices surface mounted onto substrate 20 via solder joints 24. The electronic devices 22 have a top surface oppositely disposed from a bottom surface and the top surface is in thermal contact with the corresponding compliant pedestals 30 integrally formed in the upper housing heat sink member 12. The solder bumps 24, as seen in FIG. 4, extend from the lower surface of the flip chip device 22 and are electrically coupled within the flip chip device 22. The flip chip 22 is mounted to the substrate 20 such that the solder bumps 24 are registered with electrical conductors on the upper surface of substrate 20. While a solder connection is shown and described herein, it should be appreciated that other electrical connections, such as wire bond connectors, may be employed to connect electronic devices 22 to substrate 20.

The electronic devices 22 may include any of a number of power dissipating semiconductor devices generally having electrical circuitry, such as integrated circuitry, intended to contact electrical current. For example, the semiconductor devices 22 may include one or more surface mount components, such as semiconductor flip chips. Other examples of electronic devices 22 that may be employed include insulated gate bipolar transistor (IGBT) devices, application specific integrated circuit (ASIC) devices, chip scale devices (CSP), ball grid arrays (BGA), transistors, and other active or passive circuit devices. When electrical current passes through the electrical circuitry in the electronic devices 22, thermal energy (heat) is generated within the electronic devices 22 due to electrical resistance.

The solder joints 24 are preferably thin to maintain low thermal resistance of the electronic devices 22 to the thermal conductive housing. The solder joints 24 may be formed of a known solder, such as eutectic or lead free solder. Additionally, an underfill material 26, such as polymeric material, is disposed between the electronic device 22 and the top surface of substrate 20 to fill the region around the solder bumps 24. The underfill material 26 may promote thermal cycle life of the solder connections 24.

In the embodiments shown, the upper and lower housing members 12 and 14 are made of a thermally conductive material and both operate as heat sinks to dissipate heat away from the electronic devices 22 to the outside environment. Upper and lower housing members 12 and 14 are held together by a holder, shown as an adhesive 15 according to one embodiment. Alternately, the holder may be fasteners (e.g., screws), clips, or other mechanisms that may be used to secure the upper and lower housing members 12 and 14 together and hold the heat sink in thermal contact with the electronic devices 22.

The lower housing member 14 is shown having a plurality of cooling fins 40 to provide a large surface area for dispensing the thermal energy to a fluid (e.g., air) in the surrounding environment by way of convection. The lower housing member 14 may be formed as a die cast case that includes a die cast aluminum alloy, such as aluminum alloy 380, for transmitting thermal energy received from the bottom surface of substrate 20 and semiconductor devices 22 to the surrounding environment. The upper housing member 12 may likewise be made of a similar aluminum alloy formed as a die cast cover fit to engage the lower housing member 14 and close the housing.

Disposed in direct contact and thermal heat transfer relationship with the upper surface of the electronic devices 22 is the heat sink upper housing member 12. According to the first embodiment, the upper housing member 12 employs a stamped aluminum sheet 16 having openings 34 punched or drilled therein, and a lower sheet of copper cladding 18 formed on the bottom surface. The copper cladding 18 is then shaped to form the compliant pedestals 30. The formation of the compliant pedestals 30 may be achieved by stamping copper cladding layer 18 with a press extending through the holes 34 in aluminum layer 16 to form thin protruding pedestals 30 as locations that will align with corresponding electronic devices 22.

As seen in FIG. 4, each compliant pedestal 30 has thin angled (tapered) wall 32 that leads to a flat bottom end contact surface 38 that conforms to the like-shaped flat top surface of an electronic device 22. The contact surface 38 is intended to contact the top surface 28 of a corresponding electronic device 22 and may or may not include a thermal conductive lubricant applied to one or both surfaces. The angled wall 32 provides a compliant spring-like characteristic to the compliant pedestal 30 such that the compliant pedestal 30 compresses to apply a compressive force to the top surface of the semiconductor device 22. The angled wall 32 may have a thickness in the range of about 10-20 mils for achieving a spring that can deliver around 250 pounds per square inch (psi) to the electronic device 22.

The spring rate design for the compliant pedestals 30 should be sufficient such that enough compressive force is provided to ensure good thermal contact between the contact surface of the compliant pedestal 30 and the top surface of the electronic device 22 during the molding process, but not too much force that may cause deformation of the solder bumps 24 prior to molding. According to one embodiment, the spring rate of the compliant pedestal 30 is designed to deliver approximately 250 psi of force to the top side of the corresponding electronic device 22. Since the electronic devices 22 are shown underfilled with underfill material 26, a large compressive force can be applied to the device backside 22.

The compliant pedestals 30 shown in the first embodiment can be formed by various methods. As described above in connection with the first embodiment, the pedestals 30 are formed by cladding the thin copper sheet 18 to the aluminum back plate 16, which previously had holes 34 punched therein. The thin compliant pedestals 30 are then stamped in the copper layer 18, which creates the contact spring-like structure. According to other embodiments, mechanical milling or stamping the area near each pedestal 30 can be used to thin the metal cover. After stamping in the compliant pedestals 30, the wall of each pedestal 30 or area near the pedestal 30 is thinner and acts as a metal spring.

Referring to FIG. 5, an electronic package 10' is shown employing a compliant pedestal 30' according to a second embodiment formed in upper housing heat sink member 12 having a single layer of aluminum. According to this embodiment, each compliant pedestal 30' is formed by mechanically stamping to form the recessed pedestal 30' and milling a reduced thickness groove 50 in an area surrounding the pedestal 30' to form a metal spring-like structure in the upper housing. The reduced thickness groove 50 may be formed such that the thinned portion 52 of the cover has a thickness of about 5-20 mils according to one example. The ring-shaped reduced thickness groove 50 formed by milling in the upper housing member 12 is sufficiently thin to provide the desired spring rate to apply compressive force at a desired rate to the top surface of the electronic device 22 to maintain sufficient thermal contact therewith. By maintaining sufficient thermal contact between the compressive pedestal 30' and the top of the electronic device 22, enhanced thermal energy dissipation through the upper housing heat sink 12 is achieved.

Referring to FIG. 6, an electronic package 10" is shown employing a compliant pedestal 30", according to a third embodiment of the present invention. In this embodiment, the upper housing member 12 is stamped to form a protruding pedestal 30", and a ring-shaped reduced thickness groove 60 surrounding the pedestal 30" is milled at an angle to provide a desired spring rate. The reduced thickness groove 60 may be formed such that a thinned portion 62 of the cover has a thickness of about 5-90 mils according to one example.

Additionally, an overmolding material 70 is disposed between the upper housing member 12 and the bottom housing member 14. The overmolding material 70 operates as the holder to secure the upper and lower housing members 12 and 14 together and to hold the upper heat sink member 12 in thermal contact with the electronic device 22. According to one exemplary embodiment, the overmolding material may be an epoxy mold compound such as thermoset materials commercially available as Cookson 200SH-01 or Henkle MG33F-0602. The overmolding material 70 is then cured to adhere the housing together.

It should be appreciated that the overmolding material 70 may be employed as the holder in any of the disclosed embodiments to hold the upper housing member 12 to the substrate 20, with or without the lower housing member 14. The spring compression provided by the compliant pedestals 30" may be used, in this embodiment, only during the molding process to achieve the necessary contact with the top surface of the electronic devices 22 prior to molding. Once the overmolding material 70 is cured, the overmolding material 70 bonds the assembly together with an epoxy mold compound which also helps to ensure good thermal contact between the electronic devices 22 and the compliant pedestals 30". In this embodiment, a spring rate and contact force may be sufficient with the overmolding material since flexing during vibration is less of an issue.

Accordingly, the electronic package 10 advantageously provides for a cost-effective package and method to heat sink electronic devices 22 on a substrate 20 to a heat sink member 12, such as the thermal conductive cover 12 of a housing. The use of the compliant pedestal 30, 30' or 30" integrally formed in the heat sink member 12 advantageously provides physical and thermal contact between the top side of the electronic devices 22 and the heat sink 12 via the compliant pedestal. It should be appreciated that the use of a heat sink 12 with integrally formed compliant pedestal 30, 30' or 30" compressed against the surface of an electronic device 22 for dissipating thermal energy may likewise be applicable to an electronic package employing circuits on multiple sides of a substrate, without departing from the teachings of the present invention.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. An electronic package comprising:
   a substrate;
   an electronic device having opposed first and second surfaces mounted on the substrate;
   a holder for rigidly fixing said substrate and the first surface of said electronic device;
   a thermally conductive heat sink assembled over the electronic device, said heat sink including a substantially rigid base portion and at least one compliant pedestal integrally formed with said base portion, said pedestal defining a substantially flat contact surface portion and a thinned portion resiliently interconnecting said base and contact surface portions,
   wherein said contact surface portion is continuously resiliently biased against said second surface of said electronic device to form a thermally conductive path therebetween.

2. The electronic package as defined in claim 1, wherein the package comprises a housing comprising an upper housing member and a lower housing member, wherein the upper housing member comprises the thermally conductive heat sink.

3. The electronic package as defined in claim 2, wherein the lower housing member comprises a case and the upper housing member comprises a cover, and wherein the substrate rests on an inside surface of the case.

4. The electronic package as defined in claim 1, wherein the electronic device is soldered to circuitry on the substrate.

5. The electronic package as defined in claim 1, wherein the substrate comprises a printed circuit board having a plurality of electronic devices mounted on a surface, and the heat sink has a plurality of compliant pedestals each contacting a different electronic device.

6. The electronic package as defined in claim 1, wherein the electronic device is an integrated circuit chip.

7. The electronic package as defined in claim 6 further comprising an underfill material disposed between the chip and substrate.

8. The electronic package as defined in claim 1, wherein the holder comprises an overmolding material disposed between the heat sink and the substrate.

9. The electronic package as defined in claim 1, wherein the holder comprises an adhesive for holding the heat sink in place such that the contact surface compresses against the second surface of the electronic device.

10. The electronic package as defined in claim 1, wherein the heat sink comprises aluminum.

11. The electronic package as defined in claim 10, wherein the heat sink further comprises copper.

12. The electronic package as defined in claim 1, wherein the thermally conductive heat sink further comprises a reduced thickness groove formed around the pedestal.

13. The electronic package of claim 1, wherein said base portion, contact surface portion and thinned portion of said heat sink are commonly formed from thermally conductive material.

14. The electronic package of claim 13, wherein said thermally conductive material comprises aluminum.

15. The electronic package of claim 13, wherein said thermally conductive material comprises aluminum layered with a copper alloy.

* * * * *